(12) United States Patent
Yoon et al.

(10) Patent No.: US 8,625,362 B2
(45) Date of Patent: Jan. 7, 2014

(54) DATA SENSING DEVICE NON-VOLATILE MEMORY

(75) Inventors: Jung Hyuk Yoon, Anyang (KR); Dong Keun Kim, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 229 days.

(21) Appl. No.: 12/980,257

(22) Filed: Dec. 28, 2010

(65) Prior Publication Data

US 2011/0317497 A1 Dec. 29, 2011

(30) Foreign Application Priority Data

Jun. 24, 2010 (KR) .................. 10-2010-0060054

(51) Int. Cl.
*G11C 7/10* (2006.01)

(52) U.S. Cl.
USPC ...... 365/189.05; 365/145; 365/163; 365/201; 365/230.03; 365/230.08

(58) Field of Classification Search
USPC .............. 365/145, 163, 201, 230.08, 189.05, 365/230.03
See application file for complete search history.

(56) References Cited

U.S. PATENT DOCUMENTS

| 4,802,134 A * | 1/1989 | Tsujimoto ................ 365/230.09 |
| 5,086,413 A * | 2/1992 | Tsuboi et al. ............ 365/230.01 |
| 6,337,812 B1 * | 1/2002 | Tokito et al. ............ 365/189.05 |
| 6,381,191 B2 * | 4/2002 | Ooishi ..................... 365/230.03 |
| 7,266,030 B2 * | 9/2007 | Do et al. ...................... 365/207 |

FOREIGN PATENT DOCUMENTS

KR 1020060076162 A 7/2006

* cited by examiner

*Primary Examiner* — Thao Bui

(57) ABSTRACT

A non-volatile memory device for measuring a read current of a unit cell is provided. The non-volatile memory device includes a unit cell configured to read or write data, a column switching unit configured to select the unit cell in response to a column selection signal, a sense amplifier controlled by a sense-amplifier enable signal, configured to sense and amplify data that is received from the unit cell through the column switching unit, a first latch unit configured to latch the sense-amplifier enable signal for a predetermined time when a test code signal received from an external part is activated, a column controller configured to output a latch control signal in response to a combination of a column switch-off signal and a column control signal, and a second latch unit configured to control whether or not the column selection signal is latched in response to an activation state of the latch control signal.

16 Claims, 9 Drawing Sheets

DATA SENSING DEVICE NON-VOLATILE MEMORY

CROSS-REFERENCE TO RELATED APPLICATION

The priority of Korean patent application No. 10-2010-0060054 filed on Jun. 24, 2010, the disclosure of which is hereby incorporated in its entirety by reference, is claimed.

BACKGROUND OF THE INVENTION

Embodiments of the present invention relate to a non-volatile memory device, and more specifically, to a technology for measuring a read cell current in a non-volatile memory that performs a sensing operation using a current.

Memory devices can be classified as either a volatile memory device or a non-volatile memory device. A non-volatile memory device includes a non-volatile memory cell capable of preserving stored data even when it is not powered. For example, a non-volatile memory device may be implemented as a flash random access memory (flash RAM), a phase change random access memory (PCRAM), or the like.

The PCRAM includes a memory cell that is implemented using a phase change material such as germanium antimony tellurium (GST). If heat is applied to the GST, it changes to a crystalline phase or an amorphous phase, thereby storing data in the memory cell.

A non-volatile memory device (e.g., a magnetic memory, a phase change memory (PCM), or the like) has a data processing speed similar to that of a volatile RAM device. The non-volatile memory device also preserves data even when power is turned off.

FIGS. 1A and 1B illustrate a conventional phase change resistor (PCR) element 4.

Referring to FIGS. 1A and 1B, the PCR element 4 includes a top electrode 1, a bottom electrode 3, and a phase change material (PCM) layer 2 located between the top electrode 1 and the bottom electrode 3. If a voltage and a current are applied to the top electrode 1 and the bottom electrode 3, a current signal is provided to the PCM layer 2, and a temperature of the PCM layer rises, such that an electrical conductive status of the PCM layer 2 changes depending on resistance variation. In this case, the PCM layer 2 may be generally formed of AgInSbTe. The PCM layer 2 uses chalcogenide, main components of which are chalcogen elements (e.g., S, Se and Te). In more detail, the PCM layer 2 may be formed of a germanium antimony tellurium alloy ($Ge_2Sb_2Te_5$) composed of Ge—Sb—Te.

FIGS. 2A and 2B illustrate a phase change principle of the conventional PCR element 4.

Referring to FIG. 2A, if a current less than a threshold value flows in the PCR element 4, the PCM layer 2 has a temperature suitable for a crystalline phase. Therefore, the PCM layer 2 changes to the crystalline phase, which has a low-resistance.

On the other hand, as shown in FIG. 2B, if a current greater than the threshold value flows in the PCR element 4, the PCM layer 2 has a temperature higher than a melting point. Therefore, the PCM layer 2 changes to an amorphous phase, which has a high-resistance.

As described above, the PCR element 4 can store data corresponding to two resistance phases as non-volatile data. For example, if the PCR element 4 has a low-resistance phase set to data '1' and the PCR element 4 has a high-resistance phase set to data '0', the PCR element 4 may store two logic states for data.

In addition, a phase of the PCM layer (i.e., a phase change resistive material) 2 does not change even when the phase change memory device is powered off. This allows the aforementioned data to be stored as non-volatile data.

FIG. 3 illustrates a write operation of a conventional PCR cell.

Referring to FIG. 3, when a current flows between the top electrode 1 and the bottom electrode 3 of the PCR element 4 for a predetermined time, heat is generated. Therefore, the PCM layer 2 changes from a crystalline phase to an amorphous phase in response to the heat applied to the top electrode 1 and the bottom electrode 3.

In this case, assuming that a low current flows in the PCR element 4 for a predetermined time, a crystalline phase is formed by a low-temperature heating state, such that the PCR element 4 serving as a low-resistance element enters a set state. Otherwise, assuming that a high current flows in the PCR element 4 for the predetermined time, an amorphous phase is formed by a high-temperature heating state, such that the PCR element 4 enters a reset status. Thus, a difference between two phases is represented by a variation in electrical resistance.

Accordingly, in order to write the set state during a write operation mode, a low voltage is applied to the PCR element 4 for a long period of time. On the other hand, in order to write the reset state during the write operation mode, a high voltage is applied to the PCR element 4 for a short period of time.

FIG. 4 is a structural diagram illustrating a read path of a conventional phase change memory device.

Referring to FIG. 4, the conventional phase change memory device includes a unit cell C, a column switching unit 10, and a sense amplifier (sense-amp) 11.

In this case, the unit cell C is coupled between a word line WL and a bit line. The column switching unit 10 is coupled between the bit line of the unit cell C and an input/output (I/O) line SIO, so that it is controlled by a column selection signal. The column switching unit 10 is selectively turned on in response to the column selection signal, so that it controls a connection between the bit line and the I/O line SIO.

Only one signal from among a plurality of column selection signals is activated in an active operation mode, so that a unit cell C coupled to a corresponding bit line is selected.

The sense amplifier 11 is coupled to the I/O line SIO, amplifies a sensing current of the unit cell C, and thus outputs a sensing signal SAOUT.

The aforementioned conventional phase change memory device detects a difference in resistance of the unit cell C selected by the column switching unit 10 using a current, and amplifies the detected resistance difference using the sense amplifier 11.

When measuring a current for a read operation mode, the conventional phase change memory device uses a method disclosed in FIG. 5.

Referring to FIG. 5, as can be seen from the sensing signal SAOUT, a read operation is repeated several times. Some points (e.g., points P1, P2 and P3) selected from among the sensing signal SAOUT are established, and the sensing signal SAOUT obtained from the points P1, P2 and P3 are averaged. A read current is measured using the average result.

However, the above-mentioned read current measurement method includes a current sensed in a read state, a current sensed in a standby state, and other current components in the average resultant value. Therefore it is impossible for the aforementioned read current measurement method to accurately measure the read current.

BRIEF SUMMARY OF THE INVENTION

Various embodiments of the present invention are directed to providing a non-volatile memory device that substantially obviates one or more problems due to limitations and disadvantages of the related art.

An embodiment of the present invention relates to a non-volatile memory device that measures a current generated in a read operation under the condition that an enable time of a sense amplifier is latched, measures a current flowing in the remaining parts other than a cell by mandatorily turning off a column switching unit selecting the cell, and correctly measures a cell current generated in the read operation using a difference between two measurement results.

In accordance with one embodiment of the present invention, the non-volatile memory device includes a unit cell configured to store data, a column switching unit configured to select the unit cell in response to a column selection signal, a column controller configured to output a latch control signal in response to a column switch-off signal and a column control signal, and a second latch unit configured to latch the column selection signal in response to the latch control signal and a test code signal.

In accordance with another embodiment of the present invention, a non-volatile memory device includes a unit cell configured to store data, a column switching unit configured to select the unit cell in response to a column selection signal, a sense amplifier controlled by a sense-amplifier enable signal, configured to sense and amplify data from the unit cell, a first latch unit configured to latch a sensing control signal determining a sensing timing point of the sense amplifier, for a predetermined time, a test controller configured to output a read control signal upon receiving the sensing control signal, a test code signal, and an output signal of the first latch unit, a read signal controller configured to control an activation timing point of the sense-amplifier enable signal in response to the read control signal, a column controller configured to output a latch control signal in response to a combination of a column switch-off signal and a column control signal, and a second latch unit configured to control whether or not the column selection signal is latched in response to an activation state of the latch control signal.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1A:
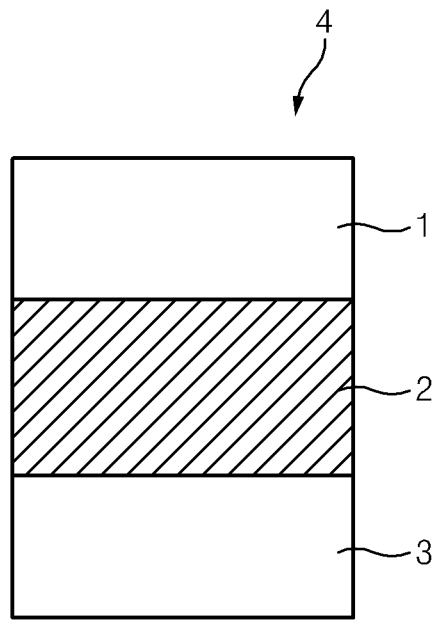
FIGS. 1A and 1B illustrate a conventional phase change resistor (PCR) element.
Figure 1B:
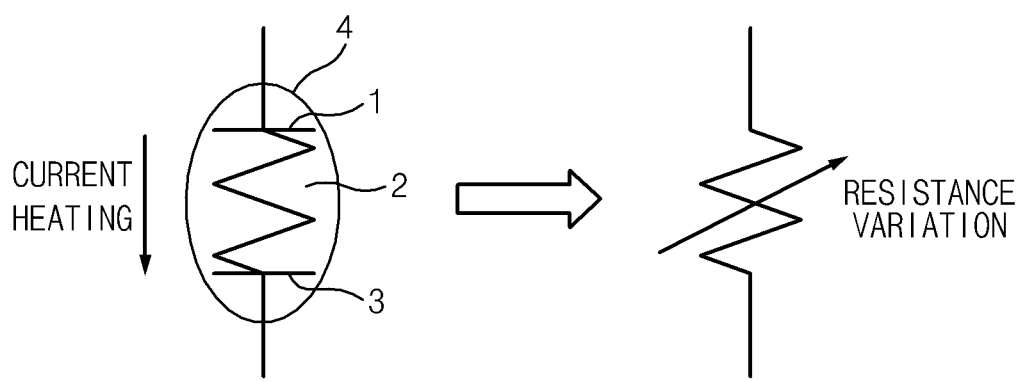
Figure 2A:
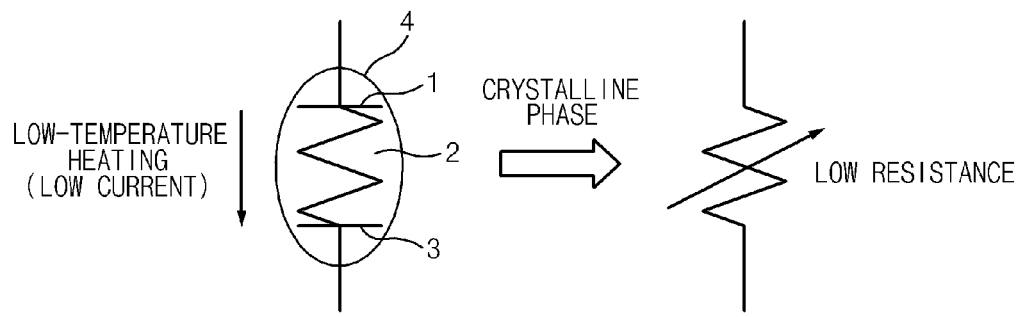
FIGS. 2A and 2B illustrate a phase change principle of the conventional PCR element.
Figure 2B:
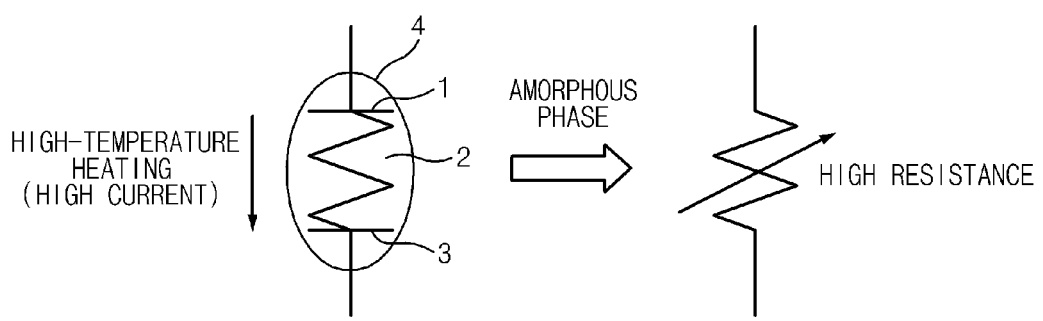
Figure 3:
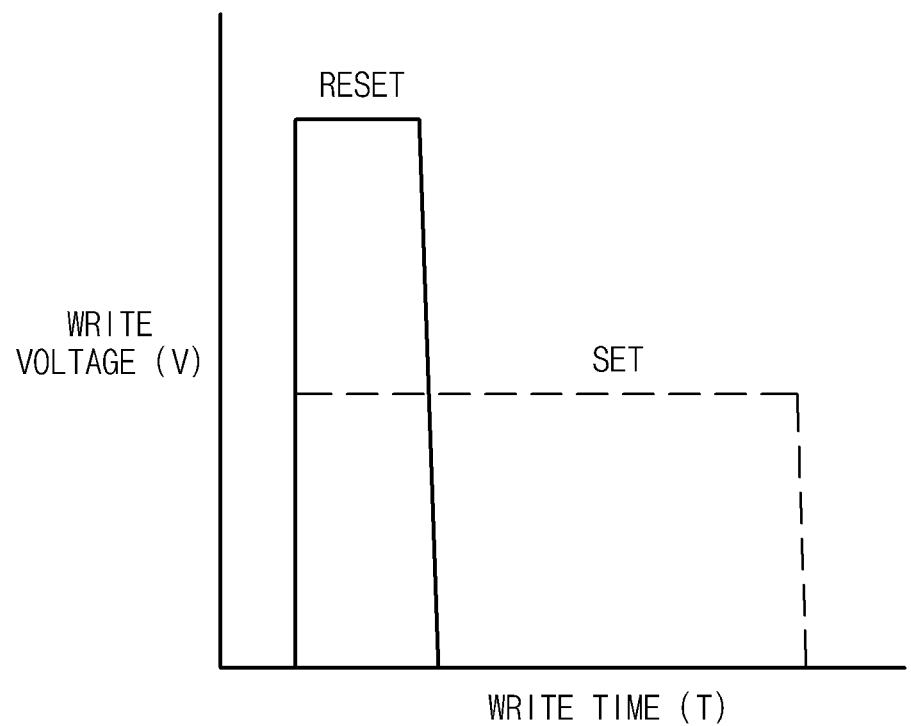
FIG. 3 illustrates a write operation of the conventional PCR cell.
Figure 4:
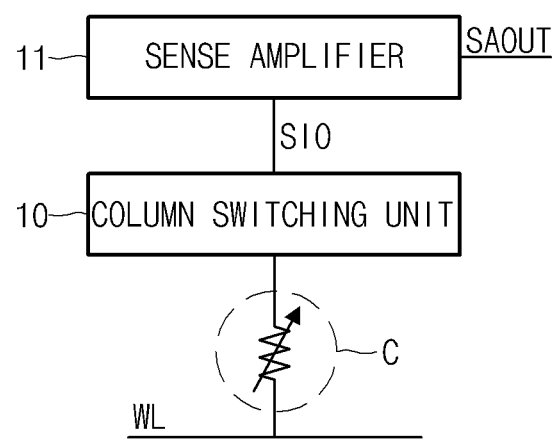
FIGS. 4 and 5 illustrate a structure of a conventional phase change memory device and a method for reading data according to the related art, respectively.
Figure 5:
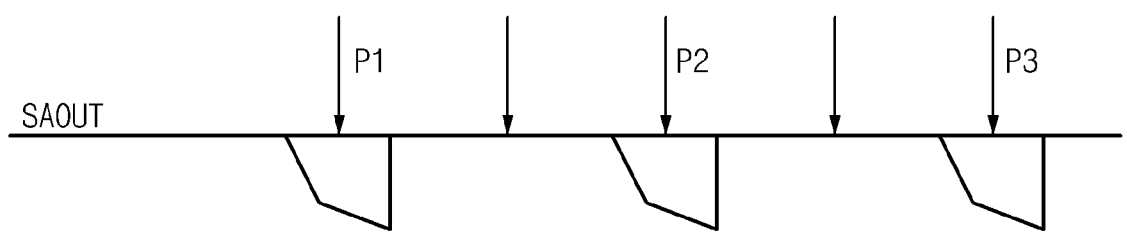
Figure 6:
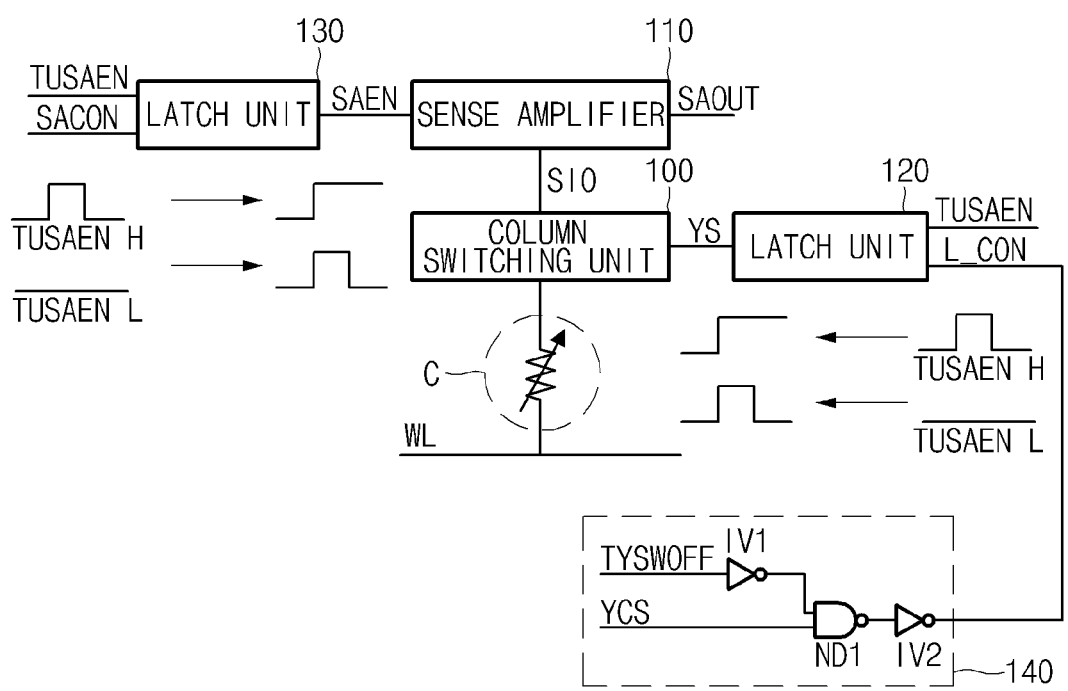
FIGS. 6 and 7 illustrate a structure of a non-volatile memory device and a method for reading data according to an embodiment of the present invention, respectively.

FIG. 6 illustrates a non-volatile memory device according to an embodiment of the present invention.

Referring to FIG. 6, the non-volatile memory device includes a unit cell C, a column switching unit 100, a sense amplifier 110, latch units 120 and 130, and a column controller 140.

In this case, the unit cell C is coupled between a word line WL and a bit line. The column switching unit 100 is coupled between the bit line of the unit cell C and an I/O line SIO, so that it is controlled by a column selection signal YS. The column switching unit 100 is selectively turned on in response to the column selection signal YS, so that it controls connection between the bit line and the I/O line SIO.

In an active operation mode, only one of several column selection signals YS is activated, so that the unit cell C coupled to the corresponding bit line is selected.

The sense amplifier 110 is coupled to the I/O line SIO, and a sensing current of the unit cell C is amplified in response to a sense-amplifier enable signal SAEN, so that the sense amplifier 110 outputs a sensing signal SAOUT.

The latch unit 120 receives a latch control signal L_CON and a test code signal TUSAEN as input signals, so that it controls a latch operation of the column selection signal YS. The latch unit 130 controls a latch operation of the sense-amplifier enable signal SAEN upon receiving the test code signal TUSAEN and a sense-amplifier control signal SACON.

In this case, the test code signal TUSAEN is adapted to activate the latch operation of the latch units 120 and 130 during a test mode.

The column controller 140 outputs the latch control signal L_CON to the latch unit 120 upon receiving a column switch-off signal TYSWOFF and a column control signal YCS. The column controller 140 includes inverters IV1 and IV2 and a NAND gate ND1.

The NAND gate ND1 performs a NAND operation between an inverted signal of the column switch-off signal TYSWOFF output from the inverter IV1 and the column control signal YCS, and outputs the NAND operation result. The inverter IV2 inverts an output of the NAND gate ND1, so that it outputs the latch control signal L_CON to the latch unit 120.

The above-mentioned non-volatile memory device detects a difference in resistance of the unit cell C selected by the column switching unit 100 using a current, and amplifies the detected resistance difference using the sense amplifier 110.

Figure 7:
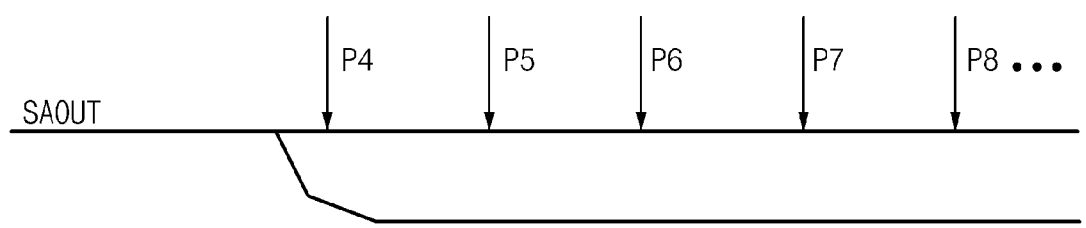

According to an embodiment of the present invention, when the non-volatile memory device measures a current in a read operation, it uses a method shown in FIG. 7.

That is, the sensing signal SAOUT of the sense amplifier 110 is output under the condition that the sense-amplifier enable signal SAEN is latched for a predetermined time according to an operation of the latch unit 130. Therefore, if the test code signal TUSAEN is activated to a high level, the sense-amplifier enable signal SAEN of the latch unit 130 continuously maintains an activation state, so that the sensing signal SAOUT of the sense amplifier 110 continuously maintains an enable state as shown in FIG. 7.

In this case, the latch unit 120 may latch the column selection signal YS for a predetermined time upon receiving the test code signal TUSAEN and the latch control signal L_CON. Therefore, if the test code signal TUSAEN is activated to a high level, the column selection signal YS continuously maintains an activation state such that the column switching unit 100 continuously maintains a turn-on state.

Therefore, the non-volatile memory device according to the present invention measures a current generated in a read operation under the condition that the sense-amplifier enable signal SAEN input to the sense amplifier 110 and the column selection signal YS input to the column switching unit 100 are latched for the predetermined time.

Thereafter, the column switching unit 100 is mandatorily turned off in response to the column selection signal YS, so that a current flowing in a circuit located at the exterior of the unit cell C is measured.

That is, while the read current of the unit cell C is measured, the column switch-off signal TYSWOFF is deactivated to a low level. Accordingly, the latch control signal L_CON goes to a high level, so that the latch unit 120 performs the latch operation and the column switching unit 100 is turned on in response to the column selection signal YS.

On the other hand, in order to measure the current flowing in the circuit located at the exterior of the unit cell C, it is necessary for the column switching unit 100 to be turned off so as to cut off a read path of the unit cell C. Accordingly, if the column switch-off signal TYSWOFF is activated to a high level, the latch control signal L_CON is deactivated to a low level. As a result, the latch operation of the latch unit 120 is terminated, and the column selection signal YS is deactivated to a low level, so that the column switching unit 100 is turned off.

In conclusion, a first read current value, which is measured when the sense amplifier 110 is latched under the condition that the column switching unit 100 is turned off, is subtracted from a second read current value, that is measured when the sense amplifier 110 is latched under the condition that the column switching unit 100 is turned on.

In this way, by measuring of a difference between the current in the read operation of the unit cell C and the current flowing in another circuit in the remaining operations other than the read operation of the unit cell C, it is possible to correctly measure the current flowing only in the unit cell C during the read operation.

In other words, the present invention can measure a current encountered in the latched sensing signal SAOUT even though the read operation is not repeated several times. After the lapse of a predetermined initial delay time, some points (e.g., points P4~P8) are established, and a read current encountered in the sensing signal SAOUT is measured at the points P4~P8.

Figure 8:
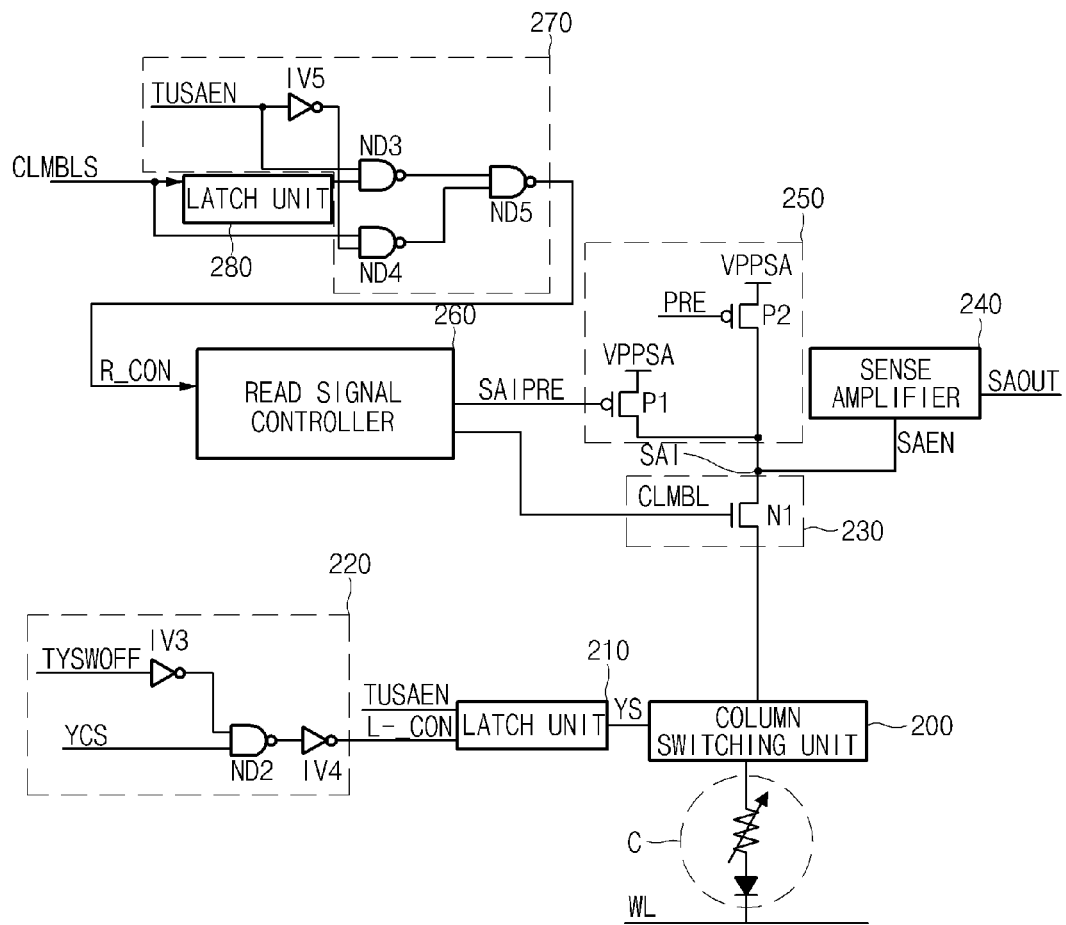
FIG. 8 is a detailed block diagram illustrating a non-volatile memory device according to another embodiment of the present invention.

FIG. 8 is a detailed block diagram illustrating a non-volatile memory device according to another embodiment of the present invention.

Referring to FIG. 8, the non-volatile memory device includes a unit cell C, a column switching unit 200, a latch unit 210, a column controller 220, a clamping unit 230, a sense amplifier (sense-amp) 240, a precharge unit 250, a read signal controller 260, a test controller 270, and a latch unit 280.

In this case, the unit cell C is coupled between a word line WL and a bit line.

The column switching unit 200 is coupled between the bit line of the unit cell C and an I/O line SIO, so that it is controlled by a column selection signal YS. The column switching unit 200 is selectively turned on in response to the column selection signal YS, so that it controls connection between the bit line and the I/O line SIO.

During an active operation mode, only one of the column selection signals YS is activated, so that a unit cell C coupled to the corresponding bit line is selected.

The latch unit 210 receives a latch control signal L_CON and a test code signal TUSAEN as input signals, so that it controls a latch operation of the column selection signal YS. In this case, the test code signal TUSAEN is an external input command signal that latches an enable timing point of the sense amplifier 240 when an operation for measuring a read current of the unit cell C is performed.

The column controller 220 outputs the latch control signal L_CON to the latch unit 210 upon receiving a column switch-off signal TYSWOFF and a column control signal YCS. The column controller 220 includes inverters IV3 and IV4 and a NAND gate ND2.

The NAND gate ND2 performs a NAND operation between an inverted signal of the column switch-off signal TYSWOFF output from the inverter IV3 and the column control signal YCS, and outputs the NAND operation result. The inverter IV4 inverts an output of the NAND gate ND2, and outputs the latch control signal L_CON to the latch unit 210.

The clamping unit 230 includes an NMOS transistor N1 that is coupled between an input terminal SAI of the sense amplifier 240 and the I/O line SIO and receives a clamping signal CLMBL through a gate terminal. The clamping unit 230 restricts a voltage applied to the input terminal SAI in response to the clamping signal CLMBL, and clamps the restricted result.

The sense amplifier 240 is coupled to the input terminal SAI, amplifies a sensing current of the unit cell C in response to a sense-amplifier enable signal SAEN, and outputs a sensing signal SAOUT. The non-volatile memory device according to this embodiment of the present invention detects a difference in resistance of the unit cell C selected by the column switching unit 200 using a current, and amplifies the detected resistance difference using the sense amplifier 240.

The precharge unit 250 includes PMOS transistors P1 and P2. In this case, the PMOS transistor P1 is coupled between a voltage (VPPSA) input terminal and the input terminal SAI, and it receives a precharge signal SAIPRE through a gate terminal. The PMOS transistor P2 is coupled between the VPPSA input terminal and the input terminal SAI, and it receives a precharge signal PRE through a gate terminal.

The read signal controller 260 controls activation timing points of the precharge signal SAIPRE and the clamping signal CLMBL upon receiving a read control signal R_CON.

The test controller 270 includes an inverter IV5 and a plurality of NAND gates ND3~ND5.

The NAND gate ND3 performs a NAND operation between the test code signal TUSAEN and an output signal of the latch unit 280. In this case, the test code signal TUSAEN is adapted to activate a latch operation of the latch unit 210 or 280.

The NAND gate ND4 performs a NAND operation between an inverted signal of the test code signal TUSAEN output from the inverter IV5 and a sensing control signal CLMBLS. In addition, the NAND gate ND5 performs a NAND operation between output signals of the NAND gates ND3 and ND4, so that it outputs the read control signal R_CON to the read signal controller 260.

The latch unit 280 latches the sensing control signal CLMBLS for a predetermined period of time, and outputs the latched result to the NAND gate ND3. In this case, the sensing control signal CLMBLS is a seed signal generated from a sense amplifier timing logic (not shown) such that it can control the clamping signal CLMBL and the precharge signal SAIPRE related to the operation of the sense amplifier 240.

A method for operating the non-volatile memory device shown in FIG. 8 will hereinafter be described with reference to FIGS. 9A and 9B.

Figure 9A:
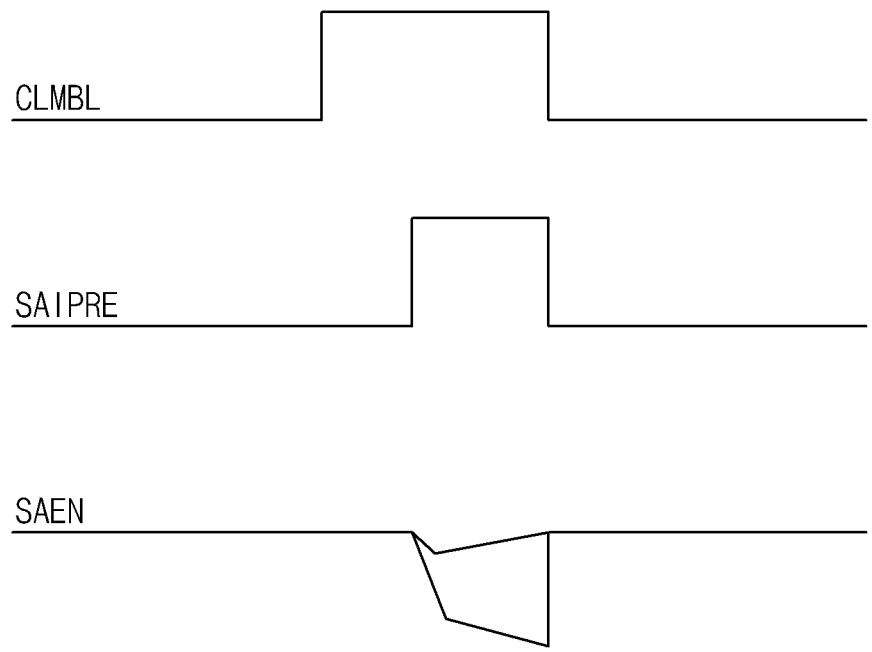
FIGS. 9A and 9B illustrate signal waveforms of the non-volatile memory device shown in FIG. 8 according to an embodiment of the present invention.

Referring to FIG. 9A, if the sensing control signal CLMBLS for controlling the operation of the sense amplifier 240 is activated, the latch unit 280 latches the sensing control signal CLMBLS for a predetermined period of time. Under this condition, if the test code signal TUSAEN is deactivated to a low level, the read control signal R_CON is deactivated to a low level.

If the read control signal R_CON is low in level, the read signal controller 260 performs a general read operation. That is, the read signal controller 260 activates the clamping signal CLMBL and the precharge signal SAIPRE for a predetermined period of time, and thus the sense-amplifier enable signal SAEN is activated for a predetermined read interval.

Figure 9B:
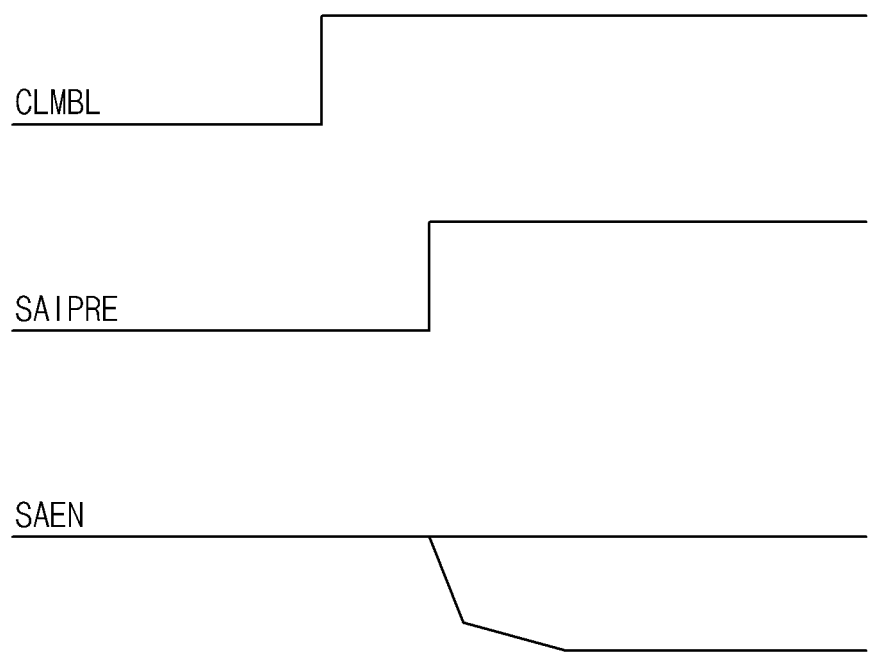

On the other hand, as shown in FIG. 9B, if the test code signal TUSAEN is activated to a high level, the read control signal R_CON is activated to a high level. If the read control signal R_CON is activated to a high level, both the clamping signal CLMBL and the precharge signal SAIPRE are latched such that a predetermined level is maintained without any change.

Therefore, if the test code signal TUSAEN is activated to a high level, the sense-amplifier enable signal SAEN continuously maintains an activation state, so that the sensing signal SAOUT acting as the output of the sense amplifier 240 continuously maintains an enable state.

In this case, the latch unit 210 latches the column selection signal YS upon receiving the test code signal TUSAEN and the latch control signal L_CON. Therefore, if the test code signal TUSAEN is activated to a high level, the column selection signal YS continuously maintains the activation state so that the column switching unit 200 can continuously maintain the turn-on state.

Therefore, the present invention can measure the current encountered in a read operation under the condition that the sense-amplifier enable signal SAEN input to the sense amplifier 240 and the column selection signal YS input to the column switching unit 200 are latched for a predetermined period of time.

Thereafter, the column switching unit 200 is mandatorily turned off in response to the column selection signal YS, so that it measures a current flowing in the circuit located at the exterior of the unit cell C.

In other words, when measuring the read current of the unit cell C, the column switch-off signal TYSWOFF is deactivated to a low level. Therefore, the latch control signal L_CON goes to a high level, so that the latch unit 210 performs a latch operation and the column switching unit 200 is turned on in response to the column selection signal YS.

On the other hand, in order to measure the current flowing in the circuit located at the exterior of the unit cell C, it is necessary for the column switching unit 200 to be turned off so as to cut off a read path of the unit cell C. Accordingly, if the column switch-off signal TYSWOFF is activated to a high level, the latch control signal L_CON is deactivated to a low level. As a result, the latch operation of the latch unit 210 is terminated, and the column selection signal YS is deactivated to a low level, so that the column switching unit 200 is turned off.

As described above, the present invention recognizes a difference between one current measured in the read operation mode of the unit cell C and the other current flowing in another circuit in the remaining operation modes other than the read operation mode, so that it can correctly measure a current that flows only in the unit cell C during the read operation.

As apparent from the above description, a non-volatile memory device according to the embodiments of the present invention measures a current generated in a read operation under the condition that an enable time of a sense amplifier is latched, measures a current flowing in the remaining parts other than a cell by mandatorily turning off a column switching unit selecting the cell, and correctly measures a cell current generated in the read operation using a difference between two measurement results.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A data sensing device of a non-volatile memory, the device comprising:
   a unit cell configured to store data;
   a column switching unit configured to select the unit cell in response to a column selection signal;
   a column controller configured to output a latch control signal in response to a column switch-off signal and a column control signal; and
   a second latch unit configured to latch the column selection signal in response to the latch control signal and a test code signal,
   wherein, when the test code signal is activated and the latch control signal is activated, the column selection signal is latched and output, and
   wherein, when the latch control signal is deactivated, the column selection signal is deactivated.

2. The data sensing device according to claim 1, further comprising:
   a first latch unit configured to latch a sense-amplifier enable signal for a predetermined time when the test code signal received from an external part is activated; and a sense amplifier controlled by the sense-amplifier enable signal, configured to sense and amplify data provided from the unit cell through the column switching unit.

3. The data sensing device according to claim 2, wherein:
a first current, that is read from an output signal of the sense amplifier during a specific period in which the sense-amplifier enable signal is latched, is sensed; and
a second current, that is read from the output signal of the sense amplifier under a condition that the column switching unit is turned off during the specific period in which the sense-amplifier enable signal is latched, is sensed.

4. The data sensing device according to claim 3, wherein a read current of the unit cell is measured using a value obtained when the second current is subtracted from the first current.

5. The data sensing device according to claim 2, further comprising:
a test controller configured to output a read control signal, upon receiving a sensing control signal, the test code signal, and an output signal of the first latch unit; and
a read signal controller configured to control an activation timing point of the sense-amplifier enable signal in response to the read control signal.

6. The data sensing device according to claim 5, further comprising:
a precharge unit configured to control a precharge operation of the sense-amplifier enable signal upon receiving a precharge signal from the read signal controller.

7. The data sensing device according to claim 6, further comprising:
a clamping unit configured to control an activation state of the sense-amplifier enable signal upon receiving a clamping signal from the read signal controller.

8. The data sensing device according to claim 7, wherein the clamping unit comprises:
an NMOS transistor that is coupled between the sense amplifier and the column switching unit and receives the clamping signal from the read signal controller through a gate terminal.

9. The data sensing device according to claim 6, wherein the precharge unit comprises:

a PMOS transistor that is coupled between a voltage terminal and the sense amplifier and receives the precharge signal from the read signal controller through a gate terminal.

10. The data sensing device according to claim 5, wherein:
when the test code signal is activated, the read control signal is latched according to an output signal of the first latch unit, and
when the test code signal is activated, the read control signal is operated according to the sensing control signal.

11. The data sensing device according to claim 5, wherein:
a first current, that is read from an output signal of the sense amplifier during a specific period in which the sense-amplifier enable signal is latched, is sensed; and
a second current, that is read from an output signal of the sense amplifier under a condition that the column switching unit is turned off during the specific period in which the sense-amplifier enable signal is latched, is sensed.

12. The data sensing device according to claim 11, wherein a read current of the unit cell is measured using a value obtained when the second current is subtracted from the first current.

13. The data sensing device according to claim 5, wherein:
when each of the column switch-off signal and the column control signal is activated, the latch control signal is deactivated; and
when the column switch-off signal is deactivated and the column control signal is activated, the column controller activates and outputs the latch control signal.

14. The data sensing device according to claim 5, wherein the test code signal is received from an external part.

15. The data sensing device according to claim 1, wherein:
when each of the column switch-off signal and the column control signal is activated, the latch control signal is deactivated.

16. The data sensing device according to claim 1, wherein the column controller is configured to activate and output the latch control signal when the column switch-off signal is deactivated and the column control signal is activated.

* * * * *